United States Patent
De et al.

(10) Patent No.: US 7,560,939 B1
(45) Date of Patent: Jul. 14, 2009

(54) ELECTRICAL DEFECT DETECTION USING PRE-CHARGE AND SENSE SCANNING WITH PRESCRIBED DELAYS

(75) Inventors: Indranil De, Palo Alto, CA (US); Kurt H. Weiner, San Jose, CA (US); Kenichi Kanai, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 124 days.

(21) Appl. No.: 11/357,374

(22) Filed: Feb. 17, 2006

(51) Int. Cl.
*G01R 31/305* (2006.01)

(52) U.S. Cl. .................................................. 324/751

(58) Field of Classification Search .................. None
See application file for complete search history.

(56) References Cited

U.S. PATENT DOCUMENTS

| | | | |
|---|---|---|---|
| 3,458,752 A | 7/1969 | Stowell | |
| 4,415,851 A | 11/1983 | Langner et al. | |
| 4,687,940 A * | 8/1987 | Ward et al. | 250/492.2 |
| 4,843,330 A * | 6/1989 | Golladay et al. | 324/751 |
| 5,045,705 A | 9/1991 | Mollenstedt | |
| 5,432,345 A | 7/1995 | Kelly | |
| 5,585,629 A * | 12/1996 | Doran et al. | 250/310 |
| 5,973,323 A | 10/1999 | Adler et al. | |
| 5,986,263 A | 11/1999 | Hiroi et al. | |
| 5,990,476 A | 11/1999 | Larson et al. | |
| 6,066,849 A | 5/2000 | Masnaghetti et al. | |
| 6,091,249 A * | 7/2000 | Talbot et al. | 324/751 |
| 6,232,787 B1 | 5/2001 | Lo et al. | |
| 6,252,412 B1 | 6/2001 | Talbot et al. | |
| 6,313,475 B1 * | 11/2001 | Renau et al. | 250/492.21 |
| 6,344,750 B1 | 2/2002 | Lo et al. | |
| 6,465,781 B1 | 10/2002 | Nishimura et al. | |
| 6,586,736 B1 | 7/2003 | McCord | |
| 6,734,429 B2 | 5/2004 | Takagi | |
| 6,765,205 B2 | 7/2004 | Ochiai et al. | |
| 6,828,571 B1 | 12/2004 | McCord et al. | |
| 6,930,309 B1 | 8/2005 | Mankos et al. | |
| 7,122,796 B2 * | 10/2006 | Hiroi et al. | 250/311 |
| 2002/0130260 A1 | 9/2002 | McCord et al. | |
| 2003/0141451 A1 | 7/2003 | Sato et al. | |
| 2005/0023486 A1 | 2/2005 | Takakuwa et al. | |

OTHER PUBLICATIONS

McCord, M.A. "Use of Ultraviolet Light in charged Particle Systems to Reduce Charging and Contamination", IBM Technical Disclosure Bulletin, Pub. No. 10a, Mar. 1990, pp. 157-158, Yorktown, U.S.A.

* cited by examiner

*Primary Examiner*—Ha Tran T Nguyen
*Assistant Examiner*—Roberto Velez
(74) *Attorney, Agent, or Firm*—Okamoto & Benedicto LLP

(57) ABSTRACT

One embodiment relates to an electron beam apparatus. The apparatus includes a mechanism for moving a substrate relative to the electron beam column at a controlled speed. A probe beam gun is configured to generate a probe beam through the column, and a pre-charging beam gun configured to generate a pre-charging beam through the column. Control circuitry configured to pre-scan a scan line with the precharging beam at least once and to subsequently sense scan the scan line with the probe beam at least once. The control circuitry is further configured so that there is a prescribed delay time between said pre-scanning and said sense scanning of the scan line. In another embodiment, a single electron beam and a deflection system configured to deflect the electron beam into pre-scans and sense scans. Other embodiments and features are also disclosed.

8 Claims, 6 Drawing Sheets

ELECTRICAL DEFECT DETECTION USING PRE-CHARGE AND SENSE SCANNING WITH PRESCRIBED DELAYS

BACKGROUND OF THE INVENTION

1. Field of the Invention

The present invention relates to electron beam apparatus used for automated inspection, or review, or metrology.

2. Description of the Background Art

It is often desirable to detect certain types of electrical defects in semiconductor wafers that have leakage due to electrical capacitance and resistance. Conventionally, such electrical defects are detected during electron beam (e-beam) inspection in one of two techniques.

In a first conventional technique, an electron probe beam is directed onto the substrate without pre-charging the substrate. The secondary electron signal is detected and analyzed in an attempt to determine the state of the interface.

In a second conventional technique, the substrate is pre-charged by flooding a relatively large area with an electron beam for an initial time period on the order of minutes (typically, a few minutes). The flooding is configured to provide a) a controlled voltage state for inspection uniformity across the spatial extent of one wafer or multiple wafers and/or b) a proper voltage state so that a subsequent probe step may actually detect the electrical defect of interest. After the flooding step, an electron probe is directed onto the substrate. Generally, there is some delay between the flooding step and the probe step which may be on the order of seconds (typically, a several seconds).

SUMMARY

Figure 1:
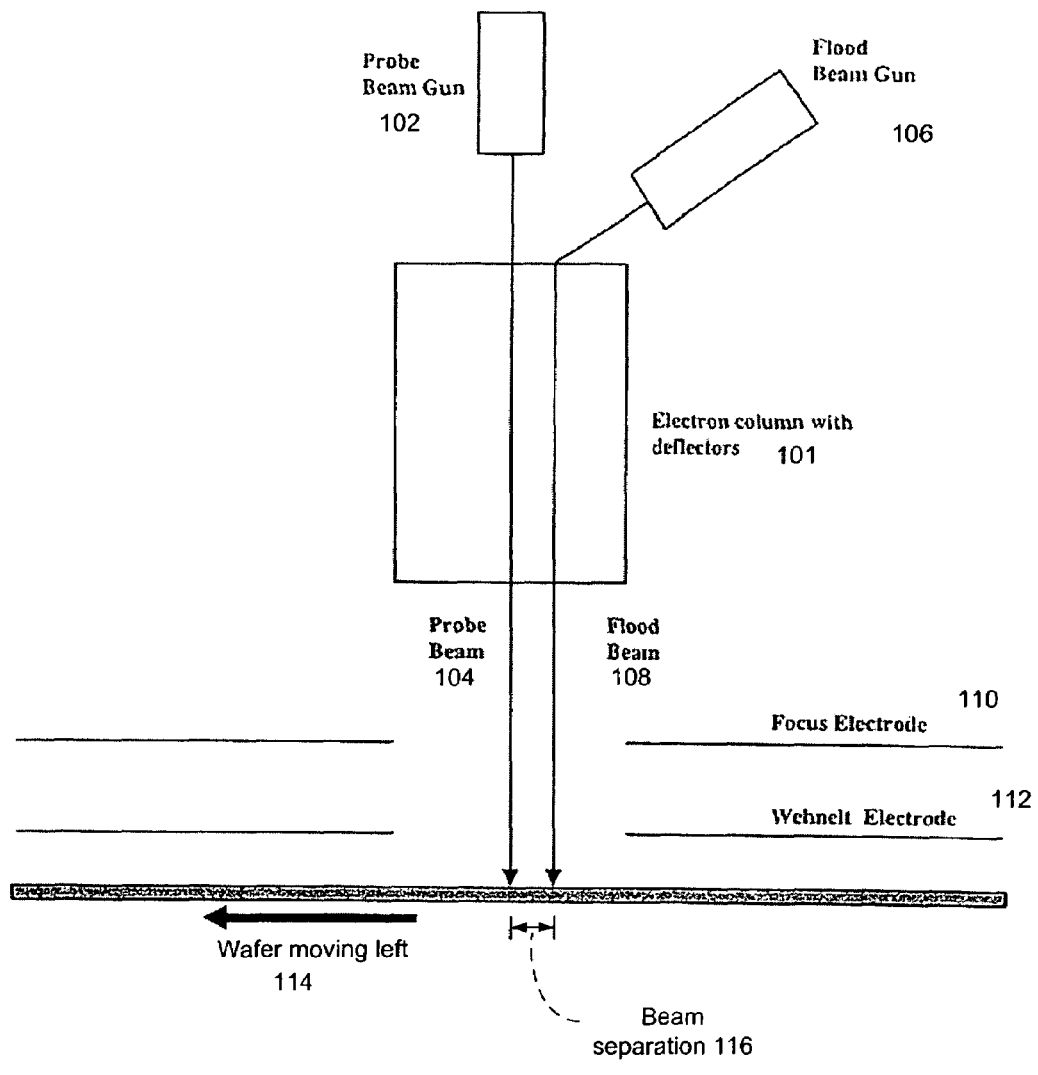
FIG. 1 is a schematic diagram of an electron beam apparatus with a probe beam gun and a flood beam gun in accordance with an embodiment of the invention.

One embodiment relates to an electron beam apparatus. The apparatus includes a mechanism for moving a substrate relative to the electron beam column at a controlled speed. A probe beam gun is configured to generate a probe beam through the column, and a pre-charging beam gun configured to generate a pre-charging beam through the column. Control circuitry configured to pre-scan a scan line with the pre-charging beam at least once and to subsequently sense scan the scan line with the probe beam at least once. The control circuitry is further configured so that there is a prescribed delay time between said pre-scanning and said sense scanning of the scan line.

In another embodiment, a single electron beam and a deflection system configured to deflect the electron beam into pre-scans and sense scans.

Another embodiment pertains to a method of automated electron beam inspection or review. A substrate is moved relative to an electron beam column at a controlled speed, and at least one electron beam is generated through the column. A scan line is pre-scanned at least once and subsequently sense scanned at least once. There is a prescribed delay time between said pre-scanning and said sense scanning of the scan line.

Other embodiments are also disclosed.

DETAILED DESCRIPTION

Drawbacks of the Conventional Flooding Technique

The above-discussed conventional flooding technique suffers from substantial drawbacks and disadvantages.

One drawback is that, when detecting electrical defects in semiconductor devices with small time constants (for example, less than one microsecond), the charging done by the flooding step will decay away before the probe step is performed. Examples of such devices may include active semiconductor diodes, MOS capacitors with thin dielectrics, and other devices. In other words, the conventional flooding step where a large area of a wafer is flooding in the order of minutes may be ineffective in controlling the surface voltage of the electrical element to be probed because the delay between the flooding and probe steps is too long.

Another drawback is that, in order to detect certain electrical defects, it is useful for the probe scan at each point on the wafer to follow the flooding step at that point after a small time delay, where the length of the time delay is prescribed by the particular electrical circuitry being probed.

For example, consider an electrical element having a capacitance with a controlled leakage and an electrical defect which manifests itself as a larger leakage in that element. The conventional flooding step may establish a voltage on the capacitor by charging it. In this case, a non-defective element with low leaking should hold sufficient charge and have a different voltage than a defective element where the charge leaks away quickly. However, if the delay between the flooding step and the probe step is too long, then the pre-charge will fully leak away from both a non-defective and a defective element. So, the voltage of both defective and non-defective elements would be the same, and the defective element would not be detected. On the other hand, if the delay between the flooding step and the probe step is too short, then hardly any charge will leak away no matter whether the element was defective or not. So, the voltage of both defective and non-defective elements would again be the same, and the defective element would again not be detected. In this case, applicants have determined that it is desirable to control the time between the flood scan and the probe scan to be in a range near the time constant of the leakage.

As another example consider an electrical element having a capacitance with a leakage and an electrical defect which manifests itself as a larger or smaller capacitance. The conventional flooding step may establish a voltage on the capacitor by charging it. In this case, a non-defective element having a correct capacitance should leak away only a certain amount of its charge and so have a different voltage than a defective element where the capacitance is larger or smaller. However, if the delay between the flooding step and the probe step is too long, then the pre-charge on both non-defective and defective elements may leak away, and the differential in capacitance between the non-defective and defective elements would not be sensed. In this case, applicants have determined that it is desirable to control the time between the flood scan and the probe scan to be less than the time constant of the leakage of the capacitor.

Pre-Charge and Sense Scanning with Prescribed Delays

FIG. 1 is a schematic diagram of an electron beam apparatus 100 with a probe beam gun 102 and a flood beam gun 106 in accordance with an embodiment of the invention. The probe beam gun 102 and the flood beam gun 104 may each include an electron source and gun lenses so as to generate, respectively, a probe electron beam 104 and a "flood" or pre-charge electron beam 108. The probe beam 104 and the pre-charge beam 108 may be transformed and controllably deflected by an electron column 101.

The apparatus 100 may be configured such that the beams pass a focus electrode 110 and a Wehnelt electrode 112 before impinging upon the wafer 114 or other substrate under automated inspection or review. The voltages on these electrodes may be set so as to focus the beams (104 and 108) onto beam spots on the substrate. In accordance with an embodiment of the invention, the beam spots may be separated by a known distance 116.

The beam spots may be scanned over a line (or area) of the substrate 114 by controlling beam scan deflectors in the column 101. A detection system (not illustrated) is utilized to detect secondary and/or backscattered electron signals.

In accordance with an embodiment of the invention, the wafer or other substrate 114 is set to move (be translated) relative to the column at a known constant speed in one direction. The motion is such that a line on the substrate which is perpendicular to the direction of motion passes first under the flood beam 108 and subsequently passes under the probe beam 104.

In accordance with an embodiment of the invention, the focus plate or "quick focus" lens 110 may be adjusted to controllably focus and de-focus the beams onto the surface. If the substrate is alternately pre-charge (flood) scanned and sense (probe) scanned, the focus electrode 110 may be switched alternatively between a first voltage during the pre-charge scanning step and a second voltage during the sense scanning step. The first voltage may be set so as to de-focus the flood beam to help establish the local charging around the points where the beam hits the substrate in a more beneficial way, while the second voltage may be set so as to more tightly focus the probe beam in a way that is more beneficial for collecting well-defined image data.

In accordance with an embodiment of the invention, the Wehnelt or field control plate 112 may be used to controllably establish the electrostatic field on the surface of the substrate. If the substrate is alternately pre-charge (flood) scanned and sense (probe) scanned, the Wehnelt or field control plate 112 may be switched alternatively between a first voltage during the pre-charge scanning step and a second voltage during the sense scanning step. The first voltage may be set so as to facilitate the attainment of a desired surface charge state during the pre-charge scanning, while the second voltage may be set so as to facilitate the attainment of a high signal-to-noise ratio during the sense scanning.

Figure 2:
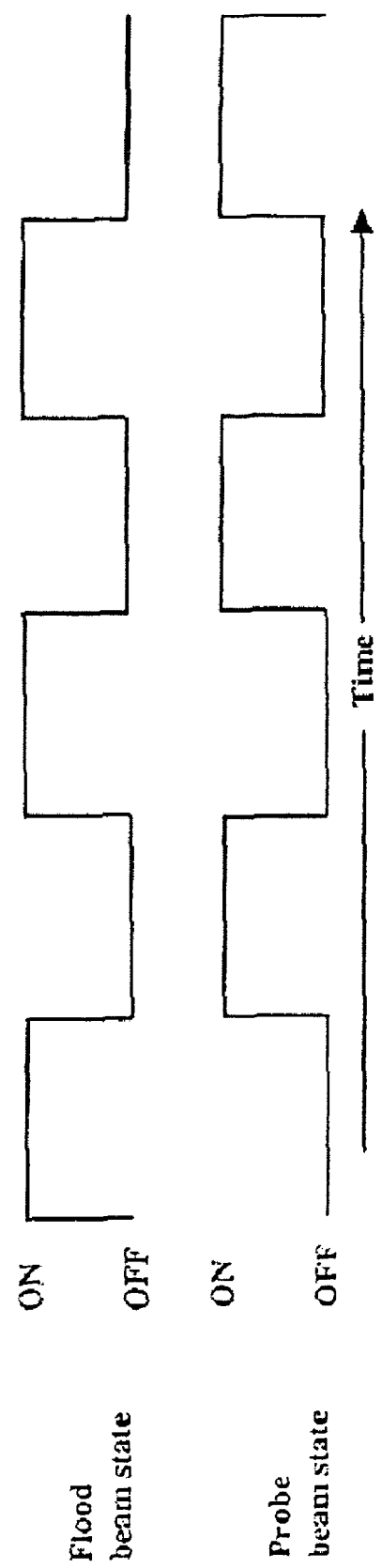
FIG. 2 is a timing diagram for operating the probe beam gun and the flood beam gun of FIG. 1 in accordance with an embodiment of the invention.

FIG. 2 is a timing diagram for operating the probe beam gun and the flood beam gun of FIG. 1 in accordance with an embodiment of the invention. First, as shown in FIG. 1, the substrate sample 114 is continuously moved under the column such that the substrate first goes under the flood (pre-charge) beam and then goes under the probe beam.

As shown in FIG. 2, the flood (pre-charge) beam may be in an ON state while the probe beam is in an OFF state, and the flood beam may be in an OFF state while the probe beam is in an ON state. In other words, the pre-charge beam and the probe beam may be turned on at different times and sequentially while maintaining a constant duty cycle. In the example illustrated in FIG. 2, the duty cycle is one half (½), but other specific duty cycles may be utilized depending, for example, on the amount of pre-charging required for the specific electronic devices.

In this embodiment, the separation 116 of the pre-charge and probe beams, together with the speed of the substrate, determines the delay time between the pre-charge scan and the probe scan. Hence, for a given prescribed delay time, the beam separation and/or the substrate speed may be adjusted so as to achieve that prescribed delay time.

Figure 3:
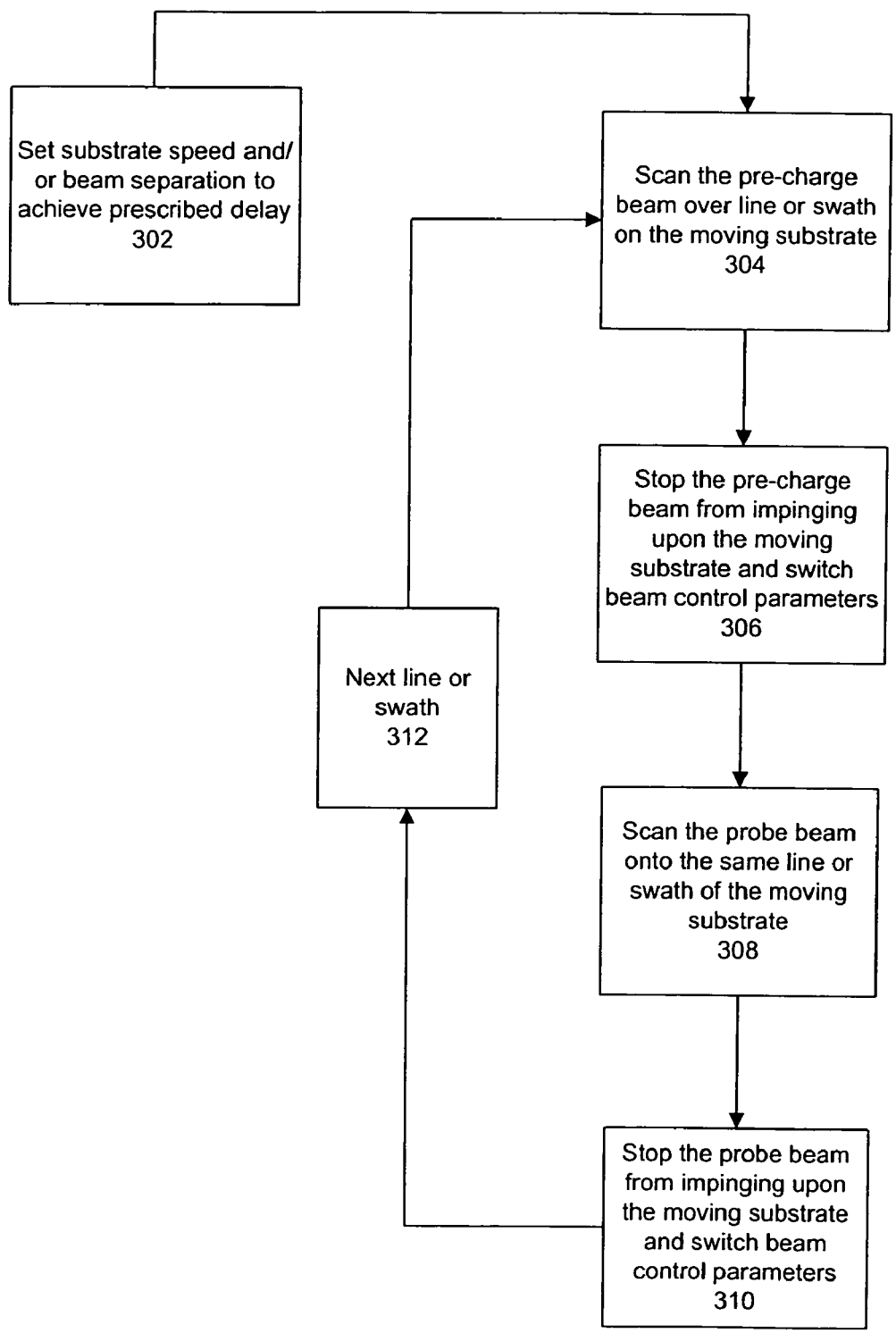
FIG. 3 is a flow chart showing a method of operating the pre-charge and probe beams per FIG. 2 in accordance with an embodiment of the invention.

FIG. 3 is a flow chart showing a method 300 of operating the pre-charge and probe beams per FIG. 2 in accordance with an embodiment of the invention. Again, as shown in FIG. 1, the substrate sample 114 is continuously moved under the column such that the substrate first goes under the flood (pre-charge) beam and then goes under the probe beam. The speed of the substrate movement and/or the beam separation may be set 302 so as to achieve a prescribed delay so as to detect particular electrical defects on the substrate.

In a first state 304, the pre-charge beam 108 may be scanned over a line or swath (including a plurality of scan lines) on the moving substrate. Once that scan is completed, the pre-charge beam may be stopped from impinging upon the moving substrate, and beam control parameters (for example, voltages on the focus and/or Wehnelt electrodes) may be switched 306 in preparation for the probe scanning. The stoppage may be performed, for example, by blocking the pre-charge beam or by deflecting the pre-charge beam away from the direction of the substrate.

In a second state 308, the probe beam 104 may be scanned over the same line or swath (including a plurality of scan lines) on the moving substrate. Once that scan is completed, the probe beam may be stopped from impinging upon the moving substrate, and beam control parameters (for example, voltages on the focus and/or Wehnelt electrodes) may be switched 310 in preparation for the pre-charge scanning.

Thereafter, the method 300 may loop back 312 and repeat for the next line or swath.

As discussed above, because the substrate speed and beam separation are accurately known or controlled, a prescribed time delay between the pre-charging and the scanning may be set 302. Hence, the above-discussed embodiment may be advantageously utilized so as to achieve a prescribed delay which, for example, is in a range near a time constant of controlled leakage from a non-defective element so as to detect a larger leakage, or is less than a time constant of leakage from a non-defective capacitor on the substrate so as to detect a larger or smaller capacitance.

Figure 4:
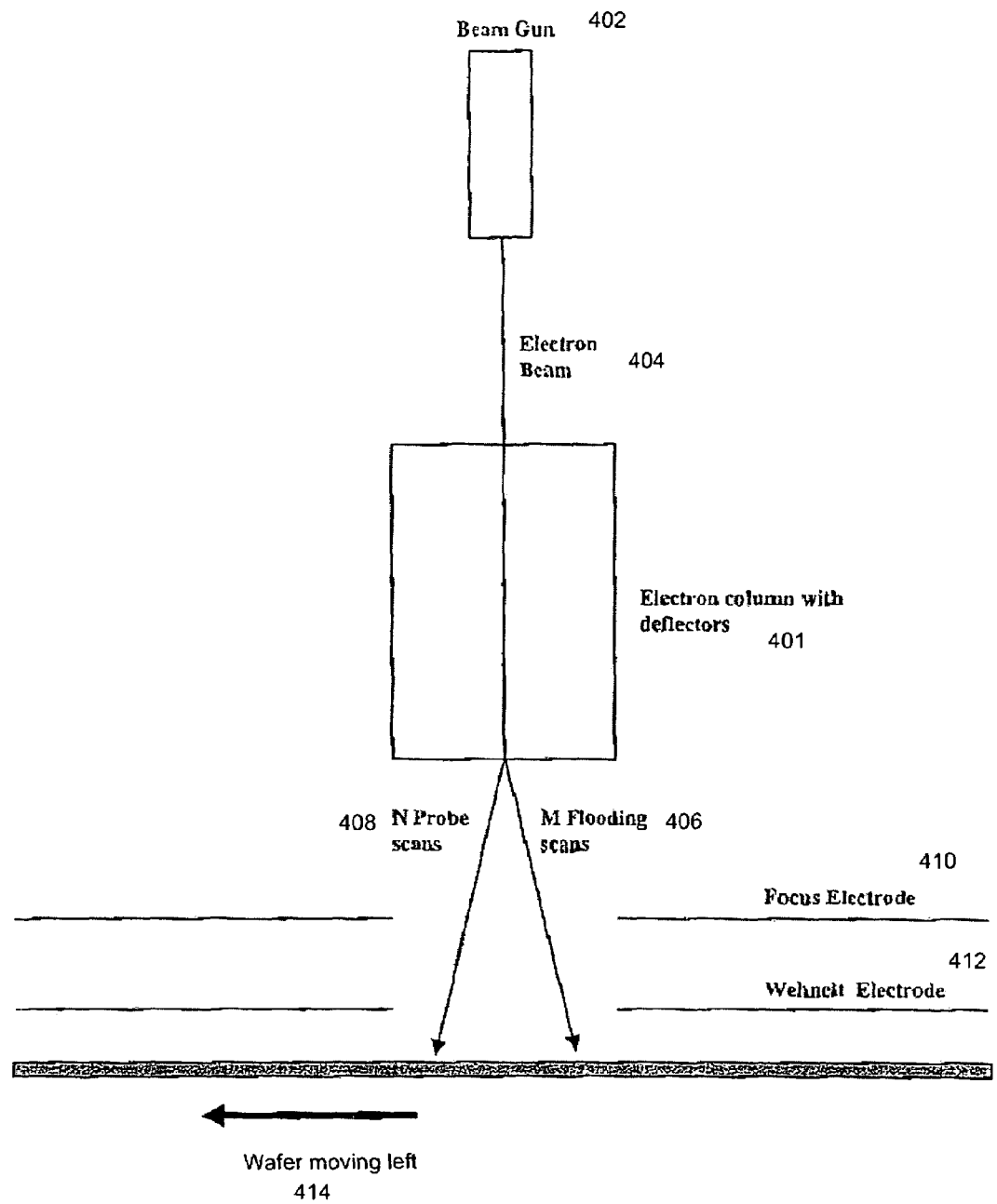
FIG. 4 is a schematic diagram of an electron beam apparatus with a single beam deflected for probe and flooding scans in accordance with an embodiment of the invention.

FIG. 4 is a schematic diagram of an electron beam apparatus 400 with a single beam 404 deflected for probe and flooding scans in accordance with an embodiment of the invention. The beam gun 402 may include an electron source and gun lenses so as to generate the incident beam 404. The beam 404 may be transformed and controllably deflected by an electron column 401.

The apparatus 400 may be configured such that the beam 404 passes a focus electrode 410 and a Wehnelt electrode 412 before impinging upon the wafer 414 or other substrate under automated inspection or review. The voltages on these electrodes may be set so as to focus the beam 404 onto a beam spot on the substrate. A detection system (not illustrated) is utilized to detect secondary and/or backscattered electron signals.

In accordance with an embodiment of the invention, the wafer or other substrate 414 is set to move (be translated) relative to the column at a known constant speed in one direction.

The beam spot may be deflected and scanned over the substrate 414 by controlling beam scan deflectors in the column 401. As discussed further below in relation to FIGS. 5 and 6, there are various schemes for deflecting the single beam 404 to achieve pre-charge 406 and probe 408 scans with pre-scribed delays therebetween.

Figure 5:
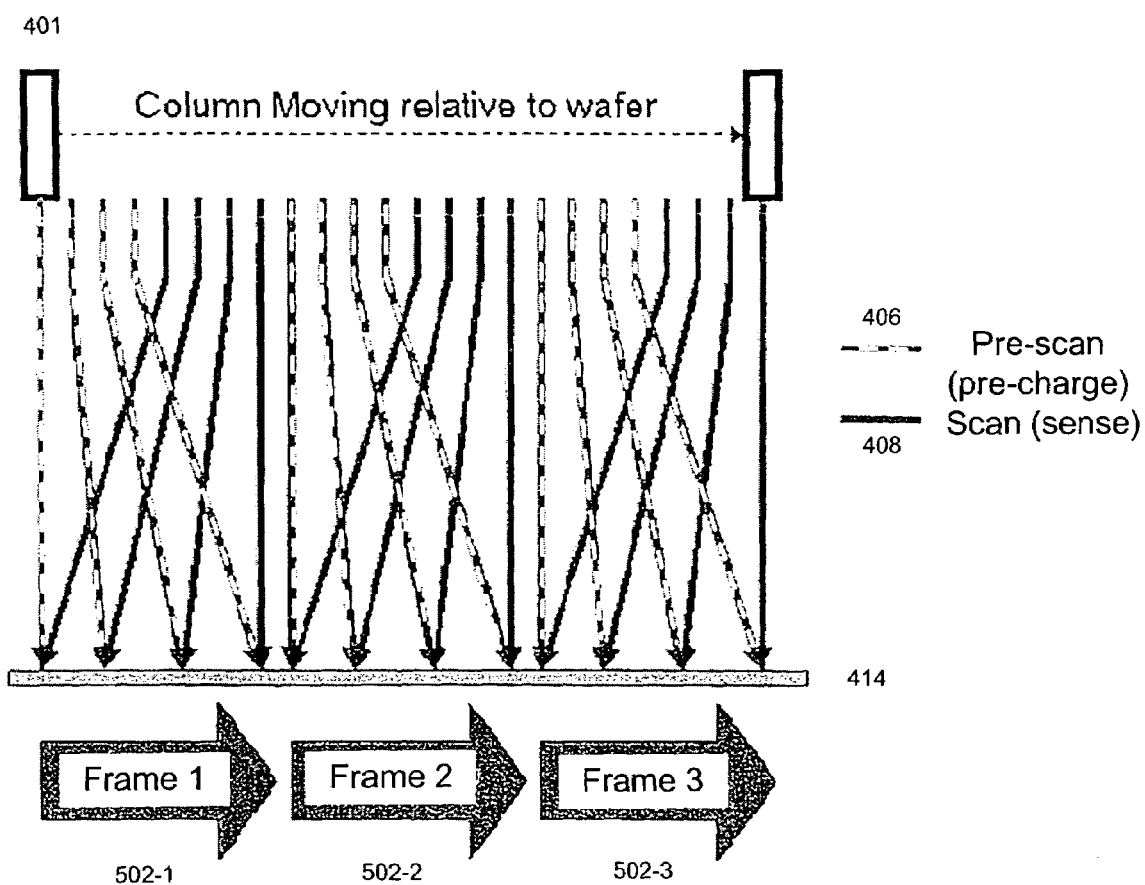
FIG. 5 is a schematic diagram depicting a scheme for real-time pre-charge and sense scanning in accordance with an embodiment of the invention.

FIG. 5 is a schematic diagram depicting a scheme for real-time pre-charge and sense scanning in accordance with an embodiment of the invention. Although the wafer or other substrate typically moves relative to a stationary column, FIG. 5 depicts a column 401 moving relative to the wafer 414 for purposes of explanation. Instead of the wafer 414 moving left relative to the column 401 in FIG. 4, the column 401 is shown moving to the right relative to the wafer 414 in FIG. 5. In other words, moving left to right at the top of FIG. 5 corresponds to the passage of time as the substrate 414 moves under the column 401.

FIG. 5 depicts the pre-charging and image capture of three image frames 502. For each frame 502, the beam 404 is first controllably deflected such that a series of pre-scans or pre-charge scans 406 is performed over the substrate area imaged in that frame. Next, the beam 404 is controllably deflected such that a series of probe scans 408 is performed over the substrate area imaged in that frame.

Four scan lines per frame are shown for purposes of illustration in FIG. 5, but in general each frame may have K scan lines per frame, where K is a configurable number. Furthermore, while FIG. 5 shows a specific instance where each scan line is pre-scanned once and probe scanned once, more generally each scan line may be pre-scanned M times and scanned N times, where M and N are configurable numbers.

Figure 6:
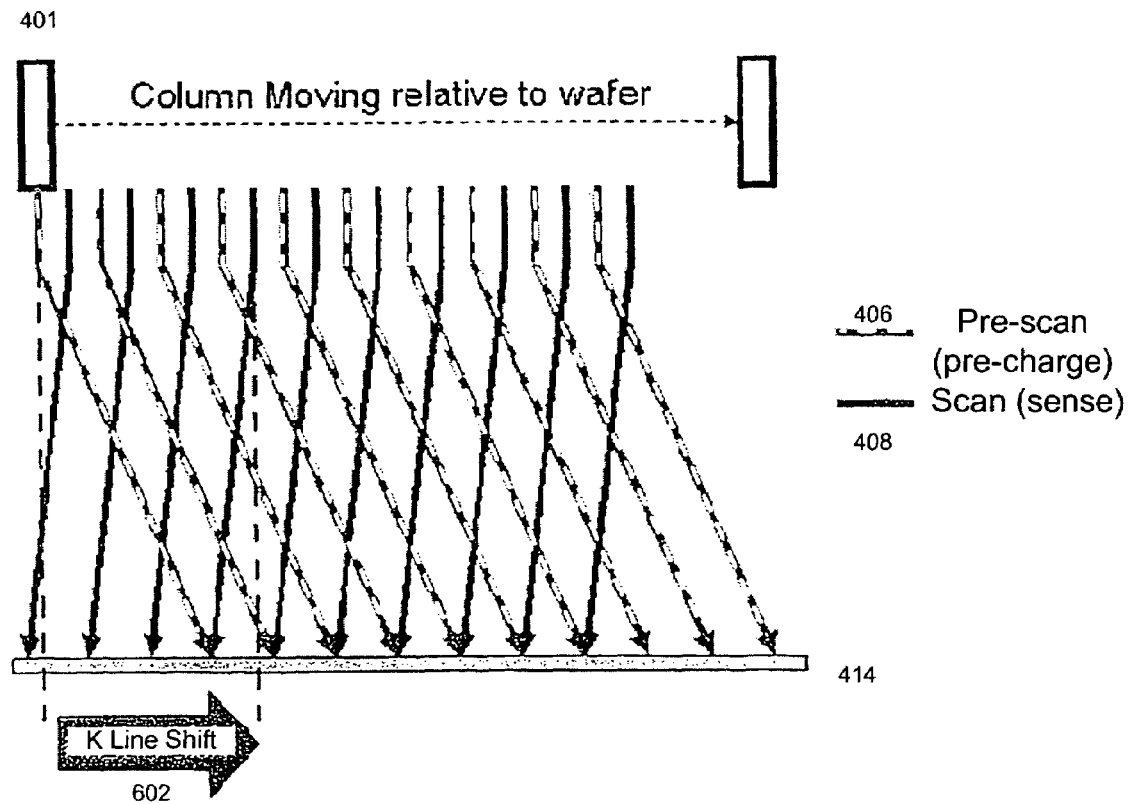
FIG. 6 is a schematic diagram depicting another scheme for real-time pre-charge and sense scanning in accordance with an embodiment of the invention.

FIG. 6 is a schematic diagram depicting another scheme for real-time pre-charge and sense scanning in accordance with an embodiment of the invention. Like FIG. 5, FIG. 6 depicts a column 401 moving relative to the wafer 414 for purposes of explanation. In other words, moving left to right at the top of FIG. 6 corresponds to the passage of time as the substrate 414 moves under the column 401.

FIG. 6 depicts the pre-charging and image capture for a series of lines. For each line, the beam 404 is first controllably deflected such that a pre-scan or pre-charge scan 406 is performed over that line. Next, the beam 404 is controllably deflected such that a probe or sense scan 408 is performed over a previously pre-scanned line.

The pre-scribed time period between a particular line being pre-scanned and sense scanned is determined by the "K Line Shift" 602 depicted in FIG. 6, along with the speed of the relative movement between the column 401 and substrate 414.

In the example illustrated in FIG. 6, the K Line shift corresponds to three and a half "duty cycles" of the pre-charge/sense scanning cycle. More generally, the K Line shift and/or the substrate translation speed may be set so as to achieve a prescribed delay time between the pre-charge and sense scanning of a line.

While FIG. 6 shows a specific instance where each scan line is pre-scanned once and probe scanned once, more generally each scan line may be pre-scanned M times and scanned N times, where M and N are configurable numbers.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam apparatus, the apparatus comprising:
an electron beam column;
a mechanism for moving a substrate relative to the electron beam column at a controlled speed;
a probe beam gun configured to generate a probe beam through the column;
a pre-charging beam gun configured to generate a pre-charging beam through the column;
control circuitry configured to pre-scan a line on the moving substrate with the pre-charging beam at least once and to subsequently sense scan the line on the moving substrate with the probe beam at least once,
wherein the control circuitry is further configured so that there is a prescribed delay time between said pre-scanning and said sense scanning of a same line on the moving substrate,
further wherein the prescribed delay time is equal to an integer-divided-by-two multiple of a duty cycle of a pre-charge/sense scanning cycle.

2. The apparatus of claim 1, wherein a beam focusing component is switched to a focusing condition after said pre-scanning and before said sense scanning, and wherein the beam focusing component is switched to a de-focusing condition after said sense scanning and before a next said pre-scanning.

3. The apparatus of claim 2, wherein the beam focusing component comprises a focus electrode.

4. The method of claim 1, wherein a field control component is switched to a high signal-to-noise ratio condition after said pre-scanning and before said sense scanning, and wherein the field control component is switched to a surface charge inducing condition after said sense scanning and before a next said pre-scanning.

5. The apparatus of claim 4, wherein the field control component comprises a Wehnelt electrode.

6. A method of automated electron beam inspection or review, the method comprising:
moving a substrate relative to an electron beam column at a controlled speed;
generating a probe beam and a pre-charging beam through the column;
pre-scanning a line on the moving substrate with the pre-charging beam at least once;
subsequently sense scanning the line on the moving substrate with the probe beam at least once; and
wherein there is a prescribed delay time between said pre-scanning and said sense scanning of a same line on the moving substrate, further wherein the prescribed delay time is equal to an integer-divided-by-two multiple of a duty cycle of a pre-charge/sense scanning cycle.

7. The method of claim 6, further comprising:

switching a beam focusing component to a focusing condition after said pre-scanning and before said sense scanning; and switching the beam focusing component to a de-focusing condition after said sense scanning and before a next said pre-scanning.

8. The method of claim 6, further comprising:

switching a field control component to a high signal-to-noise ratio condition after said pre-scanning; and switching the field control component to a surface charge inducing condition after said sense scanning and before a next said pre-scanning.

* * * * *